(12) United States Patent
Basak et al.

(10) Patent No.: US 9,951,440 B2
(45) Date of Patent: Apr. 24, 2018

(54) METHODS FOR PRODUCING LOW OXYGEN SILICON INGOTS

(71) Applicant: SunEdison Semiconductor Limited, Singapore (SG)

(72) Inventors: Soubir Basak, Chandler, AZ (US); Carissima Marie Hudson, St. Charles, MO (US); Gaurab Samanta, St. Peters, MO (US); Jae-Woo Ryu, Chesterfield, MO (US); Hariprasad Sreedharamurthy, Ballwin, MO (US); Kirk D. McCallum, Wentzville, MO (US); HyungMin Lee, Cheonan (SK)

(73) Assignee: SunEdison Semiconductor Limited, St. Peters, MO (US)

( * ) Notice: Subject to any disclaimer, the term of this patent is extended or adjusted under 35 U.S.C. 154(b) by 0 days.

(21) Appl. No.: 14/893,280

(22) PCT Filed: May 22, 2014

(86) PCT No.: PCT/US2014/039164
§ 371 (c)(1),
(2) Date: Nov. 23, 2015

(87) PCT Pub. No.: WO2014/190165
PCT Pub. Date: Nov. 27, 2014

(65) Prior Publication Data
US 2016/0108551 A1    Apr. 21, 2016

Related U.S. Application Data

(60) Provisional application No. 61/827,393, filed on May 24, 2013.

(51) Int. Cl.
*B32B 3/02*        (2006.01)
*C30B 15/20*    (2006.01)
(Continued)

(52) U.S. Cl.
CPC .............. *C30B 15/20* (2013.01); *C30B 15/04* (2013.01); *C30B 15/30* (2013.01); *C30B 15/305* (2013.01);
(Continued)

(58) Field of Classification Search
CPC ......... C30B 15/00; C30B 15/04; C30B 15/20; C30B 15/305; C30B 30/04; H01L 29/167; H01L 29/7393
See application file for complete search history.

(56) References Cited

U.S. PATENT DOCUMENTS

2002/0157600 A1* 10/2002 Fusegawa ............. C30B 15/305
                                                                117/30
2007/0193500 A1*  8/2007 Inagaki ................... C30B 15/20
                                                                117/11
(Continued)

FOREIGN PATENT DOCUMENTS

WO        2009025340 A1    2/2009

OTHER PUBLICATIONS

Wang, Yongtao, et al., Numerical simulation of effects of cusp magnetic field on oxygen concentration of 300 mm CZ-Si, Rare Metals, Oct. 2012, pp. 494-499, vol. 31, No. 5.
(Continued)

*Primary Examiner* — Elizabeth E Mulvaney
(74) *Attorney, Agent, or Firm* — Armstrong Teasdael LLP

(57) ABSTRACT

An method for producing a silicon ingot includes melting polycrystalline silicon in a crucible enclosed in a vacuum chamber to form a melt, generating a cusped magnetic field within the vacuum chamber, dipping a seed crystal into the melt, withdrawing the seed crystal from the melt to pull a single crystal that forms the silicon ingot, wherein the silicon ingot has a diameter greater than about 150 millimeters (mm), and simultaneously regulating a plurality of process
(Continued)

parameters such that the silicon ingot has an oxygen concentration less than about 5 parts per million atoms (ppma). The plurality of process parameters include a wall temperature of the crucible, a transport of silicon monoxide (SiO) from the crucible to the single crystal, and an evaporation rate of SiO from the melt.

35 Claims, 10 Drawing Sheets

(51) Int. Cl.
| | | |
|---|---|---|
| *C30B 15/30* | (2006.01) | |
| *C30B 29/06* | (2006.01) | |
| *C30B 15/04* | (2006.01) | |
| *C30B 30/04* | (2006.01) | |
| *H01L 29/165* | (2006.01) | |
| *H01L 29/167* | (2006.01) | |
| *H01L 29/739* | (2006.01) | |

(52) U.S. Cl.
CPC .............. *C30B 29/06* (2013.01); *C30B 30/04* (2013.01); *H01L 29/165* (2013.01); *H01L 29/167* (2013.01); *H01L 29/7393* (2013.01)

(56) References Cited

U.S. PATENT DOCUMENTS

2009/0235861 A1   9/2009   Fujiwara et al.
2011/0304081 A1   12/2011  Weber et al.

OTHER PUBLICATIONS

Sim, Bok-Cheol, et al., Oxygen concentration in the Czochralski-grown crystals with cusp-magnetic field, Journal of Crystal Growth, Mar. 1, 2005, vol. 275, vol. 3-4 pp. 455-459, Elsevier, Amsterdam, Neitherland.

Wetzel, TH., et al., Numerical model of turbulent CZ melt flow in the presence of AC and CUSP magnetic fields and its verification in a laboratory facility, Journal of Crystal Growth, Aug. 1, 2001, vol. 230, No. 1-2, pp. 81-91, Elsevier, Amsterdam, Neitherland.

Kakimoto, K., Heat and Mass Transfer during Crystal Growth, Science Reports of the Research Institutes, Tohoku Univ., Jan. 1, 1996, vol. A41, No. 2, pp. 107-112, Japan.

International Search Report and Written Opinion of the International Searching Authority regarding PCT/US2014/039164 dated Feb. 9, 2015, pp. 21.

* cited by examiner

METHODS FOR PRODUCING LOW OXYGEN SILICON INGOTS

CROSS-REFERENCE TO RELATED APPLICATION

This application claims priority to International Application No. PCT/US2014/039164 filed on May 22, 2014, and U.S. Provisional Patent Application No. 61/827,393 filed on May 24, 2013, the entire disclosures of which are hereby incorporated by reference in their entirety.

FIELD

This disclosure generally relates to silicon ingots, and more specifically, to producing silicon ingots having a low oxygen concentration.

BACKGROUND

Single crystal silicon is the starting material in many processes for fabricating semiconductor electronic components and solar materials. For example, semiconductor wafers produced from silicon ingots are commonly used in the production of integrated circuit chips on which circuitry is printed. In the solar industry, single crystal silicon may be used instead of multicrystalline silicon due to the absence of grain boundaries and dislocations.

To produce the semiconductor or solar wafers, a single crystal silicon ingot may be produced by melting polycrystalline silicon in a crucible and solidifying it again for a direction solidification process, or dipping a seed crystal into the molten silicon, withdrawing the seed crystal in a manner sufficient to achieve the diameter desired for the ingot, and growing the ingot at that diameter for Czochralski process. For a continuous single crystal silicon process, the method is similar to that of a batch process except the polysilicon is fed and melted simultaneously with crystal growth. The silicon ingot is then machined into a desired shape from which the semiconductor or solar wafers can be produced.

During the process, oxygen is introduced into silicon crystal ingots through a melt-solid or melt crystal interface. The oxygen may cause various defects in wafers produced from the ingots, reducing the yield of semiconductor devices fabricated using the ingots. For example, insulated-gate bipolar transistors (IGBTs), high quality radio-frequency (RF), high resistivity silicon on insulator (HR-SOI), and charge trap layer SOI (CTL-SOI) applications typically require a low oxygen concentration in order to achieve high resistivity and to avoid formation of P-N junctions.

Due to the relatively low Oi, such wafers may have relatively weak mechanical strength and relatively poor slip performance at high temperature anneal/ramp that may be requested by a device manufacturer. The mechanical strength and slip performance of low Oi wafers may be improved by co-doping them with nitrogen or carbon.

At least some known methods use float zone materials to achieve a low oxygen concentration and high resistivity. However, float zone materials are relatively expensive and are limited to use in producing ingots having a diameter less than about 200 mm. Accordingly, these known methods are unable to produce higher diameter silicon crystal ingots with a relatively low oxygen concentration.

This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF SUMMARY

One aspect is a method for producing a silicon ingot. The method includes melting polycrystalline silicon in a crucible enclosed in a vacuum chamber to form a melt, generating a cusped magnetic field within the vacuum chamber, dipping a seed crystal into the melt, withdrawing the seed crystal from the melt to pull a single crystal that forms the silicon ingot, wherein the silicon ingot has a diameter greater than about 150 millimeters (mm), and simultaneously regulating a plurality of process parameters such that the silicon ingot has an oxygen concentration less than about 5 parts per million atoms (ppma). The plurality of process parameters include a wall temperature of the crucible, a transport of silicon monoxide (SiO) from the crucible to the single crystal, and an evaporation rate of SiO from the melt.

Various refinements exist of the features noted in relation to the above-mentioned aspect. Further features may also be incorporated in the above-mentioned aspect as well. These refinements and additional features may exist individually or in any combination. For instance, various features discussed below in relation to any of the illustrated embodiments may be incorporated into the above-described aspect, alone or in any combination.

BRIEF DESCRIPTION OF THE DRAWINGS

Like reference symbols in the various drawings indicate like elements.

DETAILED DESCRIPTION

Figure 1:
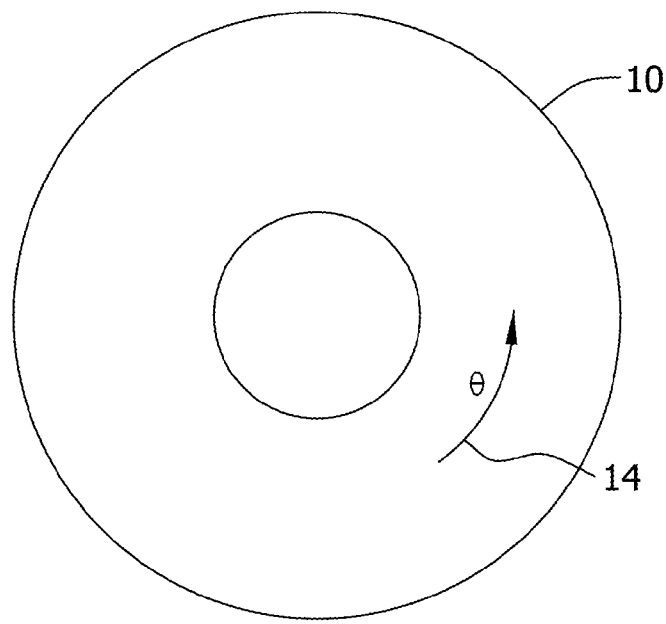
FIG. 1 is a top view of a crucible of one embodiment.
Figure 2:
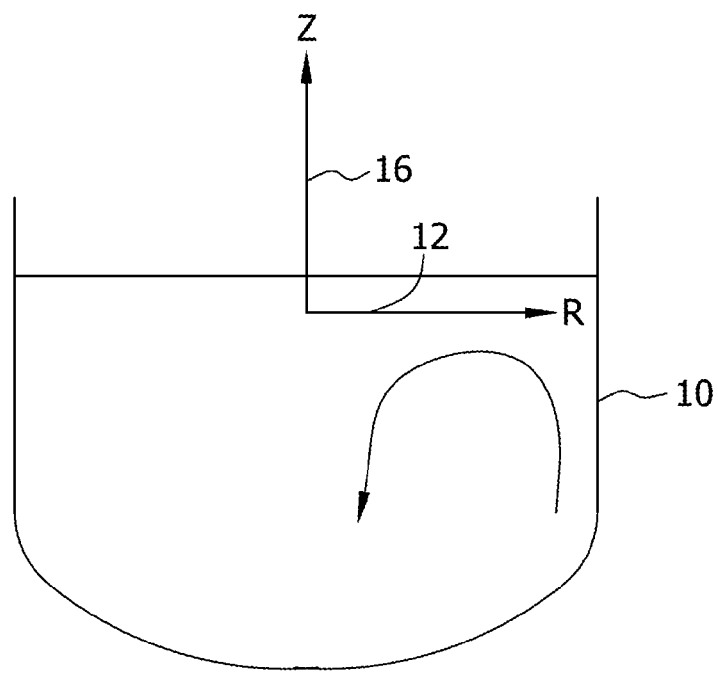
FIG. 2 is a side view of the crucible and a cylindrical coordinate system shown in FIG. 1.

Referring initially to FIGS. 1 and 2, a crucible of one embodiment is indicated generally at 10. A cylindrical coordinate system for crucible 10 includes a radial direction R 12, an angular direction θ 14, and an axial direction Z 16. Coordinates R 12, θ 14, and Z 16 are used herein to describe methods and systems for producing low oxygen silicon ingots.

Figure 3:
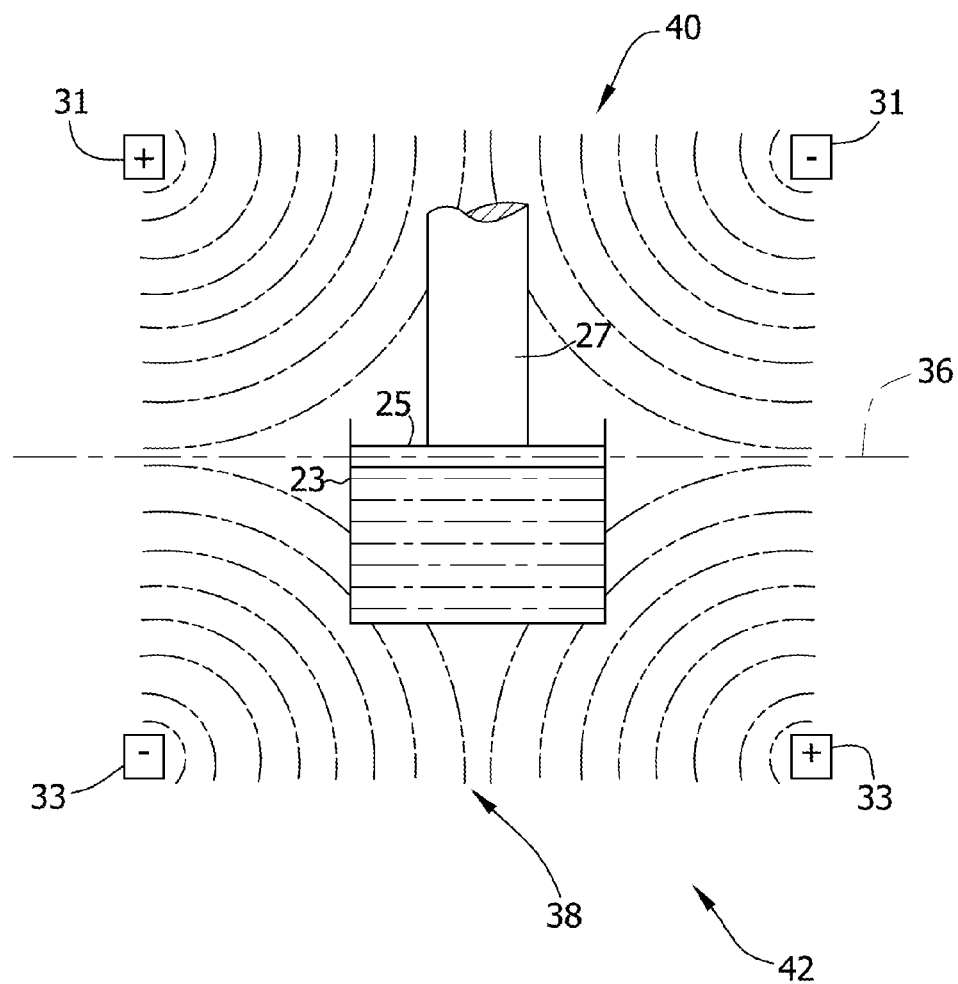
FIG. 3 is a schematic diagram illustrating a cusped magnetic field applied to a crucible containing a melt in a crystal growing apparatus.

FIG. 3 is a block diagram illustrating a cusped magnetic field being applied to a crucible 23 containing a melt 25 in a crystal growing apparatus. As shown, crucible 23 contains silicon melt 25 from which a crystal 27 is grown. The cusped magnetic field configuration is designed to overcome deficiencies of axial and horizontal magnetic field configurations. A pair of coils 31 and 33 (e.g., Helmholtz coils) are placed coaxially above and below a melt surface 36. Coils 31 and 33 are operated in an opposed current mode to generate a magnetic field that has a purely radial field component (i.e., along R 12) near melt surface 36 and a purely axial field component (i.e., along Z 16) near a center 38 of melt 25. The combination of an upper magnetic field 40 and a lower magnetic field 42 produced by coils 31 and 33, respectively, results in axial and radial cusped magnetic field components.

Figure 4:
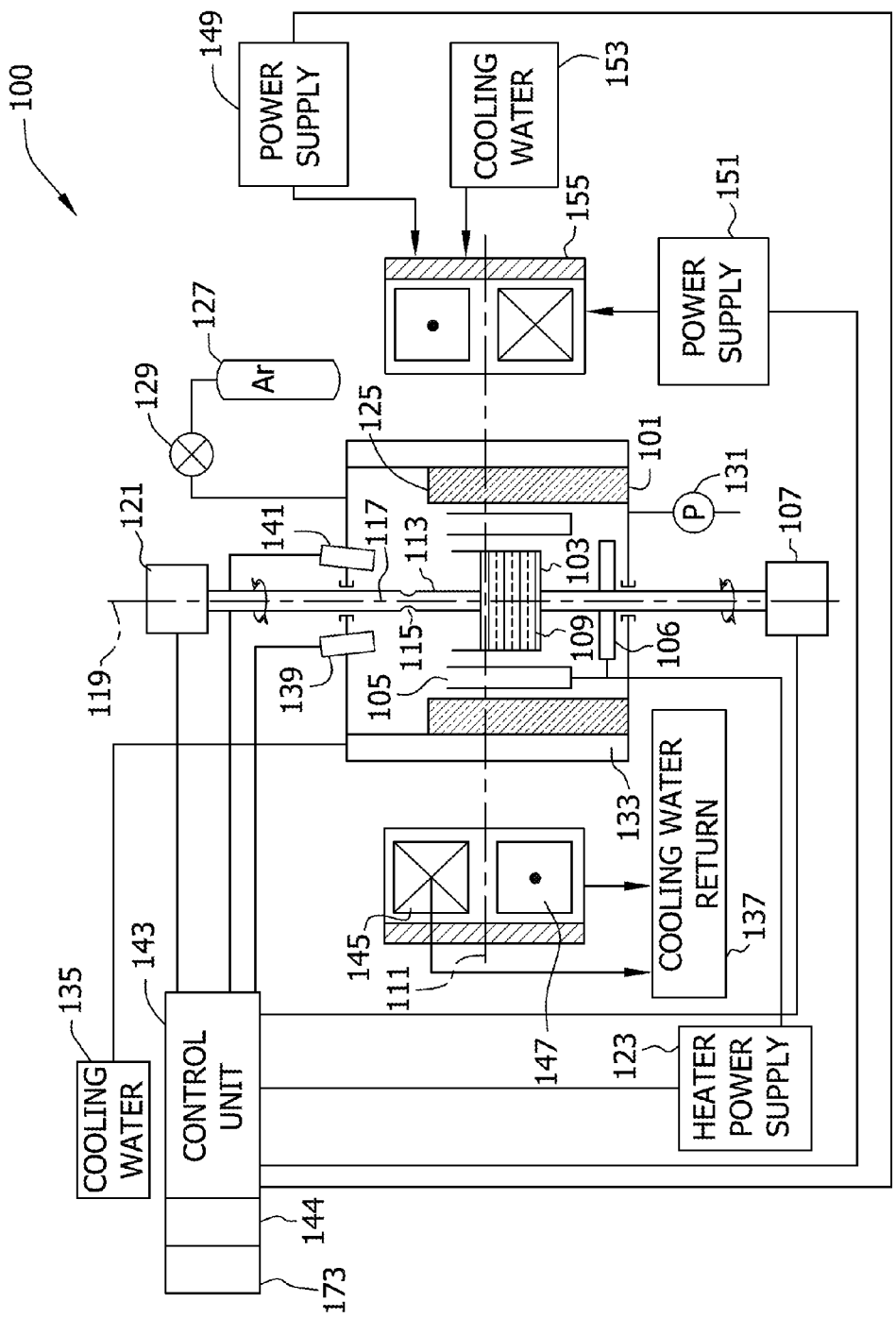
FIG. 4 is a block diagram of a crystal growing system of one embodiment.

FIG. 4 is a block diagram of a crystal growing system 100. System 100 employs a Czochralski crystal growth method to produce a semiconductor ingot. In this embodiment, system 100 is configured to produce a cylindrical semiconductor ingot having a diameter of greater than one-hundred fifty millimeters (150 mm), more specifically in a range from approximately 150 mm to 460 mm, and even more specifically, a diameter of approximately three-hundred millimeters (300 mm). In other embodiments, system 100 is configured to produce a semiconductor ingot having a two-hundred millimeter (200 mm) diameter or a four-hundred and fifty millimeter (450 mm) diameter. In general, the crystal growing system 100 includes a vacuum chamber 101 enclosing a crucible 103. A side heater 105, for example, a resistance heater, surrounds crucible 103. A bottom heater 106, for example, a resistance heater, is positioned below crucible 103. During heating and crystal pulling, a crucible drive unit 107 (e.g., a motor) rotates crucible 103, for example, in the clockwise direction as indicated by the arrow. Crucible drive unit 107 may also raise and/or lower crucible 103 as desired during the growth process. Within crucible 103 is a silicon melt 109 having a melt level or melt line 111. In operation, system 100 pulls a single crystal 113, starting with a seed crystal 115 attached to a pull shaft or cable 117, from melt 109. One end of pull shaft or cable 117 is connected by way of a pulley (not shown) to a drum (not shown), or any other suitable type of lifting mechanism, for example, a shaft, and the other end is connected to a chuck (not shown) that holds seed crystal 115 and crystal 113 grown from seed crystal 115.

Crucible 103 and single crystal 113 have a common axis of symmetry 119. Crucible drive unit 107 can raise crucible 103 along axis 119 as the melt 109 is depleted to maintain melt level 111 at a desired height. A crystal drive unit 121 similarly rotates pull shaft or cable 117 in a direction opposite the direction in which crucible drive unit 107 rotates crucible 103 (e.g., counter-rotation). In embodiments using iso-rotation, crystal drive unit 121 may rotate pull shaft or cable 117 in the same direction in which crucible drive unit 107 rotates crucible 103 (e.g., in the clockwise direction). Iso-rotation may also be referred to as a co-rotation. In addition, crystal drive unit 121 raises and lowers crystal 113 relative to melt level 111 as desired during the growth process.

According to the Czochralski single crystal growth process, a quantity of polycrystalline silicon, or polysilicon, is charged to crucible 103. A heater power supply 123 energizes resistance heaters 105 and 106, and insulation 125 lines the inner wall of vacuum chamber 101. A gas supply 127 (e.g., a bottle) feeds argon gas to vacuum chamber 101 via a gas flow controller 129 as a vacuum pump 131 removes gas from vacuum chamber 101. An outer chamber 133, which is fed with cooling water from a reservoir 135, surrounds vacuum chamber 101.

The cooling water is then drained to a cooling water return manifold 137. Typically, a temperature sensor such as a photocell 139 (or pyrometer) measures the temperature of melt 109 at its surface, and a diameter transducer 141 measures a diameter of single crystal 113. A control unit 143 may include a processor 144 that processes the signals generated by photocell 139 and diameter transducer 141. Control unit 143 may be a programmed digital or analog computer that controls crucible drive unit 107, crystal drive unit 121, heater power supply 123, vacuum pump 131, and gas flow controller 129 (e.g., an argon flow controller). The term processor, as used herein, refers to central processing units, microprocessors, microcontrollers, reduced instruction set circuits (RISC), application specific integrated circuits (ASIC), logic circuits, and any other circuit or processor capable of executing the functions described herein. In this embodiment, system 100 does not include an upper heater. The presence of an upper heater, or lack of an upper heater, alters cooling characteristics of crystal 113.

In this embodiment, an upper magnet, such as a solenoid coil 145, and a lower magnet, such as a solenoid coil 147, may be located above and below, respectively, melt level 111. In this embodiment, the coils 145 and 147, shown in cross-section, surround vacuum chamber 101 and share axes with axis of symmetry 119. In some embodiments, the upper and lower coils 145 and 147 have separate power supplies, namely, an upper coil power supply 149 and a lower coil power supply 151, each of which is connected to and controlled by control unit 143.

In this embodiment, current flows in opposite directions in the two solenoid coils 145 and 147 to produce a magnetic field. A reservoir 153 provides cooling water to the upper and lower coils 145 and 147 before draining via cooling water return manifold 137. A ferrous shield 155 surrounds coils 145 and 147 to reduce stray magnetic fields and to enhance the strength of the field produced.

In this embodiment, system 100 produces silicon crystal ingots suitable for use in device manufacturing. Advantageously, system 100 may be used to produce silicon crystal 113, a substantial portion or all of which is substantially free of agglomerated intrinsic point defects. Furthermore, system 100 may be used to produce crystal 113 having substantially no agglomerated defects that are larger than about one hundred twenty nanometers (nm) in diameter, or more particularly, about ninety nm in diameter. The shape of the melt-solid or melt-crystal interface and the pull speed is controlled during crystal growth to limit and/or suppress the formation of agglomerated intrinsic point defects.

During production, oxygen is introduced into silicon crystal ingots through the melt-solid or melt crystal interface. However, oxygen may cause various defects in wafers produced from the ingots, reducing the yield of semiconductor devices. Accordingly, it is desirable to produce silicon crystal ingots with a low oxygen concentration. Using the methods described herein, silicon crystal ingots are produced having an oxygen concentration less than about 15 ppma, less than about 8 ppma, or even less than about 5 ppma.

In this embodiment, three process parameters are regulated simultaneously to facilitate producing silicon crystal ingots with a low oxygen concentration. Specifically, a wall temperature of crucible 103, a flow (i.e., transport) of silicon monoxide (SiO) from crucible 103 to single crystal 113, and an evaporation of SiO from melt 109 are controlled. The wall temperature of crucible 103 corresponds to a dissolution rate of crucible 103. Specifically, the higher the wall temperature of crucible 103, the faster that portions of crucible 103 will react with and dissolve into melt 109, generating SiO and increasing an oxygen concentration of crystal 113. Accordingly, reducing the wall temperature of crucible 103, as used herein, equates to reducing the dissolution rate of crucible 103.

By reducing the wall temperature of crucible 103 (i.e., reducing the dissolution rate of crucible 103), reducing the flow (i.e., transport) of SiO from crucible 103 to single crystal 113, and increasing an evaporation of SiO from melt 109, the oxygen concentration of crystal 113 can be reduced. To regulate the three process parameters, a plurality of conditions are controlled. Each condition affects at least one of the three process parameters. In this embodiment, the controlled conditions are heater power, crucible rotation, magnet strength, seed lift, melt to reflector gap, inert gas flow, inert gas pressure, seed rotation, and cusp position. Each condition is described in detail herein.

Heater power refers to the power of side and bottom heaters 105 and 106. Specifically, relative to typical heating configurations, by increasing a power of side heater 105 and reducing a power of bottom heater 106, a hot spot on the wall of crucible 103 is raised close to the melt line 111. As the wall temperature of crucible 103 at or below melt line 111 is lower, the amount of SiO generated by melt 109 reacting with crucible 103 is also lower. The heater power configuration also impacts melt flow by reducing the flow (i.e., transport) of SiO from crucible 103 to single crystal 113. In this embodiment, a power of bottom heater 106 is approximately 0 to 5 kilowatts, and more specifically approximately 0 kilowatts, and a power of side heater 105 is in a range from approximately 100 to 125 kilowatts. Variations in the power of side heater 105 may be due to, for example, variation in a hot zone age from puller to puller.

Figure 5:
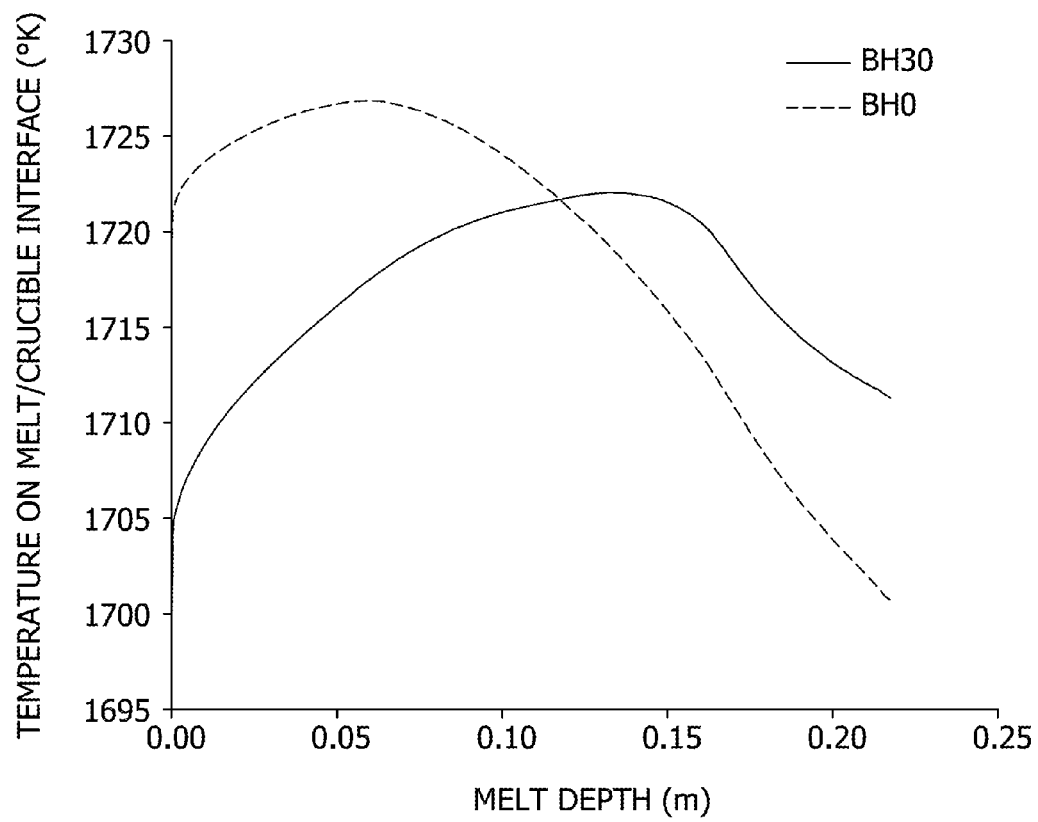
FIG. 5 is graph plotting a crucible wall temperature for different settings of a bottom heater.
Figure 6:
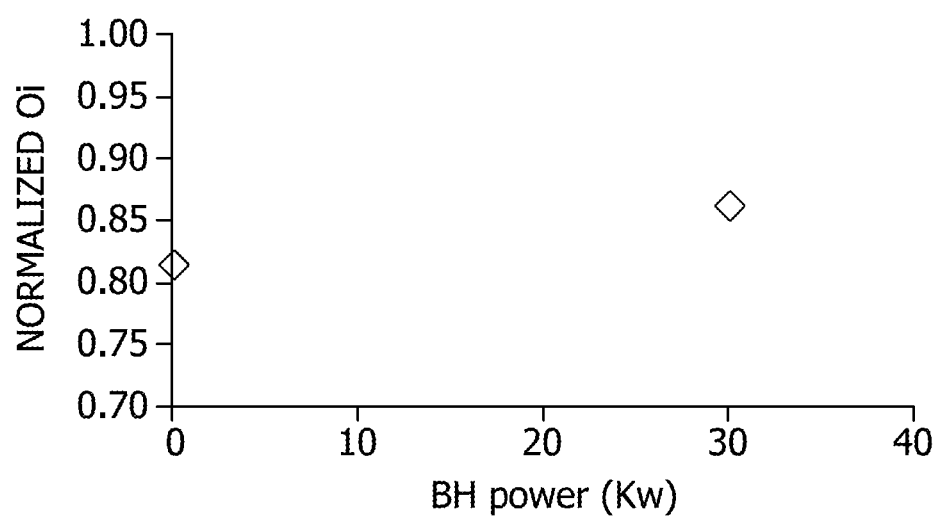
FIG. 6 is a graph plotting a bottom heater power versus an oxygen concentration.

FIG. 5 is a graph showing a modeled prediction of the wall temperature for crucible 103 for two different settings of bottom heater 106. The graph indicates that below melt line 111 (e.g., at a melt depth of approximately 0.11 meters), a power setting of 0 kilowatts (BH0) results in a lower temperature at the interface between melt 109 and crucible 103 than a power setting of 30 kilowatts (BH30). FIG. 6 is a graph showing a modeled prediction of the power of bottom heater 106 versus the oxygen concentration. As shown in the graph, the oxygen concentration is lower at a power setting of 0 kilowatts as compared to a power setting of 30 kilowatts.

Crucible rotation refers to the rate at which crucible 103 is rotated about axis 119 using crucible drive unit 107. Crucible rotation impacts the flow of SiO from crucible 103 to crystal 113 and an amount of SiO evaporating from melt 109. A high crucible rotation reduces both a boundary layer thickness between crucible 103 and melt 109, and also reduces a boundary layer thickness between melt line 111 and the gas above melt 109. However, to minimize the oxygen concentration in crystal 113, a thicker boundary layer between crucible 103 and melt 109 is desired to reduce the SiO transport rate, while a thinner boundary layer between melt line 111 and the gas above melt 109 is desired to increase the SiO evaporation rate. Accordingly, the crucible rotation is selected to balance the competing interests of a high boundary layer thickness between crucible 103 and melt 109 and a low boundary layer thickness between melt line 111 and the gas above melt 109.

Figure 7A:
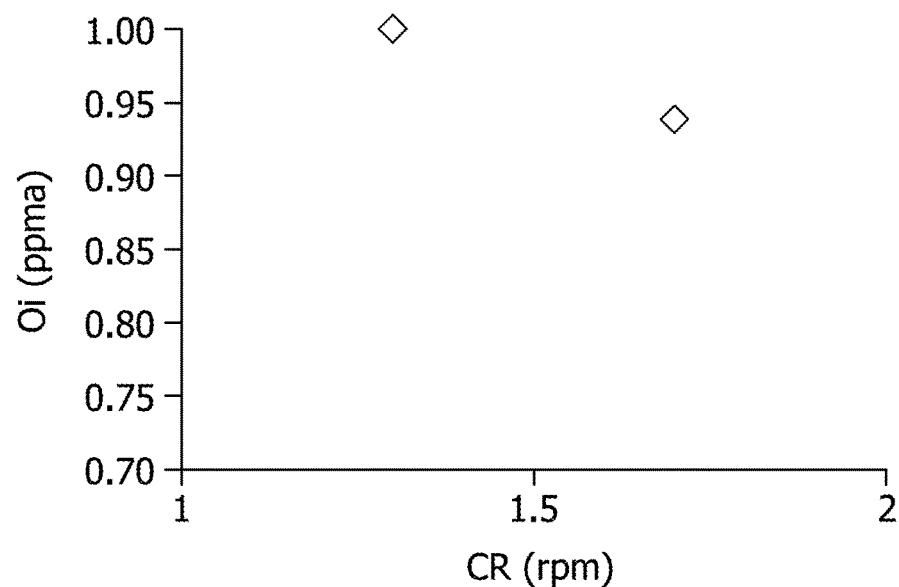
FIGS. 7A and 7B are graphs plotting a crucible rotation rate versus an oxygen concentration.
Figure 7B:
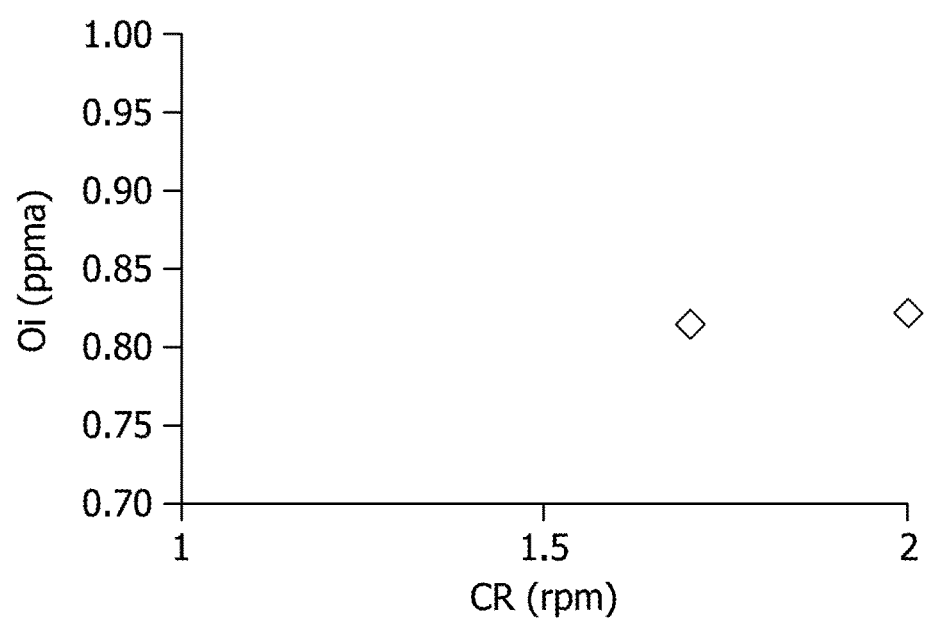

FIGS. 7A and 7B are graphs showing crucible rotation in revolutions per minute (rpm) versus the oxygen concentration. As shown in the graphs, the oxygen concentration is lowest at approximately 1.7 rpm. Accordingly, in this embodiment, the crucible rotation is in a range from approximately 1.3 rpm to 2.2 rpm, and more specifically, the crucible rotation is approximately 1.7 rpm.

Figure 8A:
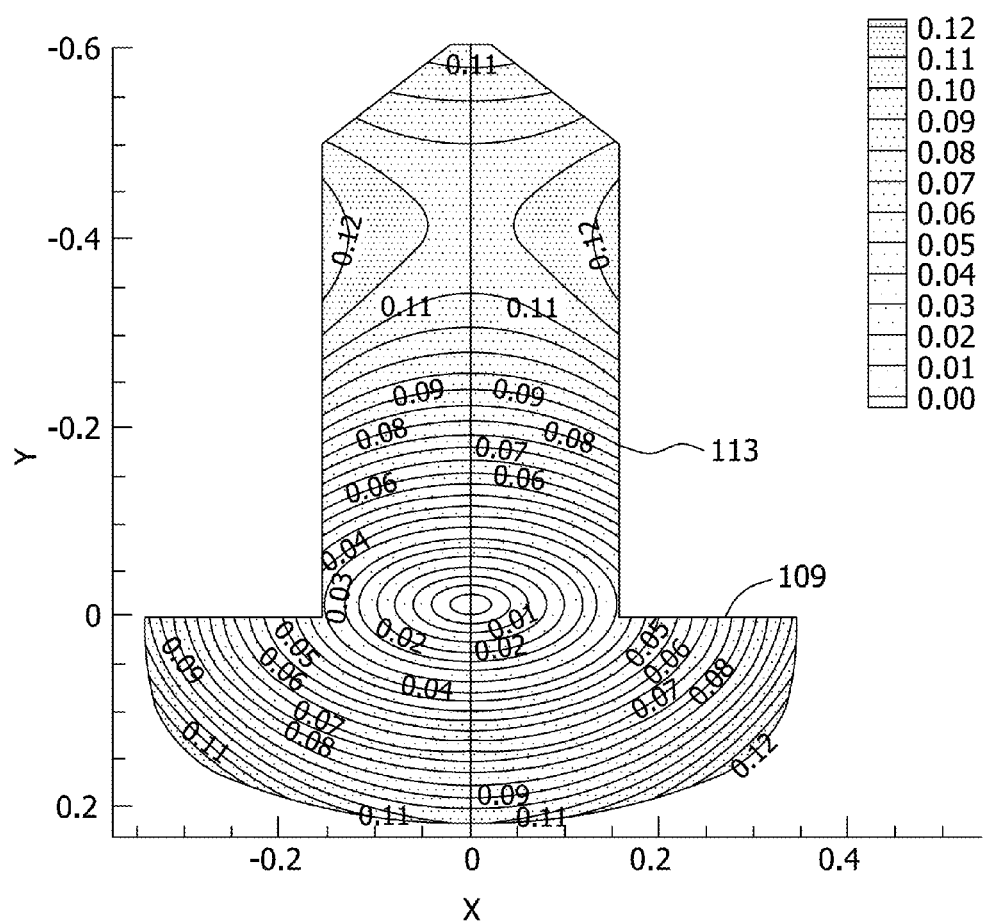
FIG. 8A is a graph showing a magnetic field strength at a crystal and a melt.

Magnet strength refers to the strength of the cusp magnetic field. More specifically, a current through coils 145 and 147 is controlled. Magnetic strength impacts the flow of SiO from crucible 103 to crystal 113. That is, a high magnetic strength minimizes the flow of SiO from crucible 103 to crystal 113 by suppressing a buoyancy force within melt 109. FIG. 8A is a graph showing the magnetic field strength at crystal 113 and melt 109. As the magnetic field suppresses the buoyancy flow, it decreases the dissolution rate of the quartz crucible, thus lowering the interstitial oxygen incorporated into the crystal. However, if the magnetic field strength increases beyond a certain level, further retardation in the buoyancy flow may result in decreasing the evaporation rate at the melt free surface, thus raising the interstitial oxygen levels.

Figure 8B:
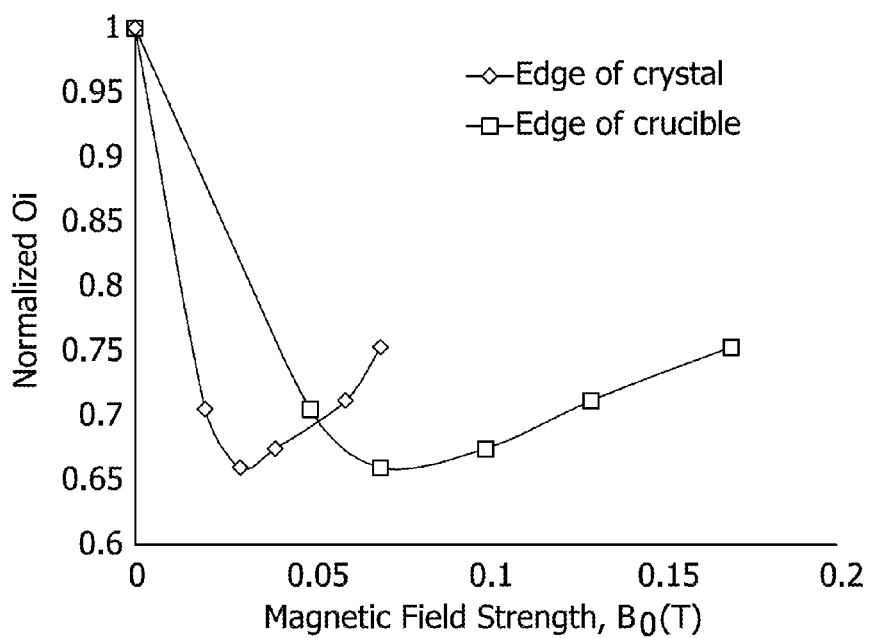
FIG. 8B is a graph plotting a magnetic field strength versus an oxygen concentration.

This is the physical mechanism behind the non-monotonic response of the interstitial oxygen to increasing cusp magnetic field strength, as shown in FIG. 8B. In this embodiment, the strength of the magnetic field is approximately 0.02 to 0.05 Tesla (T) at an edge of crystal 113 at the melt-solid interface and approximately 0.05 to 0.12 T at the wall of crucible 103.

Seed lift refers to the rate at which pull shaft or cable 117 lifts seed crystal 115 out of melt 109. Seed lift impacts the flow of SiO from crucible 103 to crystal 113. In this embodiment, seed crystal 115 is lifted at a rate in a range of approximately 0.42 to 0.55 millimeters per minute (mm/min), and more specifically 0.46 mm/min for 300 mm product. This pull rate is slower than pull rates typically used for smaller diameter (e.g., 200 mm) crystals. For example, the seed lift for 200 mm product may be in a range of approximately 0.55 to 0.85 mm/min, and more specifically 0.7 mm/min.

The pull speed, along with the combination of other process parameters, facilitates controlling the defect quality of the crystal. For example, using SP2 laser light scattering, the detected agglomerated point defects generated by the process described herein may be less than 400 count for defects less than 60 nm, less than 100 count for defects between 60 and 90 nm, and less than 100 count for less defects between 90 and 120 nm.

Melt to reflector gap refers to a gap between melt line 111 and a heat reflector (not shown). Melt to reflector gap impacts the wall temperature of crucible 103. Specifically, a larger melt to reflector gap reduces the wall temperature of crucible 103. In this embodiment, the melt to reflector gap is between approximately 60 mm and 80 mm, and more specifically 70 mm.

Figure 9:
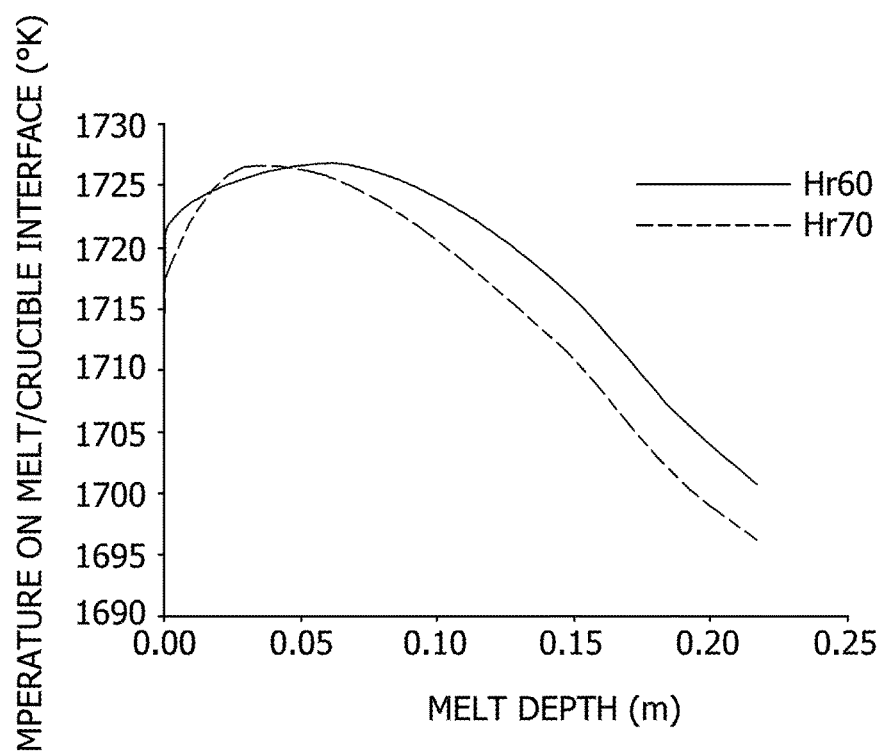
FIG. 9 is graph plotting a crucible wall temperature for different melt to reflector gap values.

FIG. 9 is a graph showing a modeled prediction of the wall temperature for crucible 103 for two different values of the melt to reflector gap. The graph indicates that below melt line 111 (e.g., at a melt depth of approximately 0.2 meters), a melt to reflector gap of 70 mm (Hr70) results in a lower temperature at the interface between melt 109 and crucible 103 than a melt to reflector gap of 60 mm (Hr60). This is due to a change in position of crucible 103 relative to side heater 105.

Inert gas flow refers to the rate at which argon gas flows through vacuum chamber 101. Inert gas flow impacts the SiO evaporation rate. Specifically, increasing the argon gas flow rate sweeps more SiO gas above melt line 111 away from crystal 113, minimizing a SiO gas partial pressure, and in turn increasing SiO evaporation. However, if the flow rate is too high, crystal growth may be negatively impacted.

Figure 10:
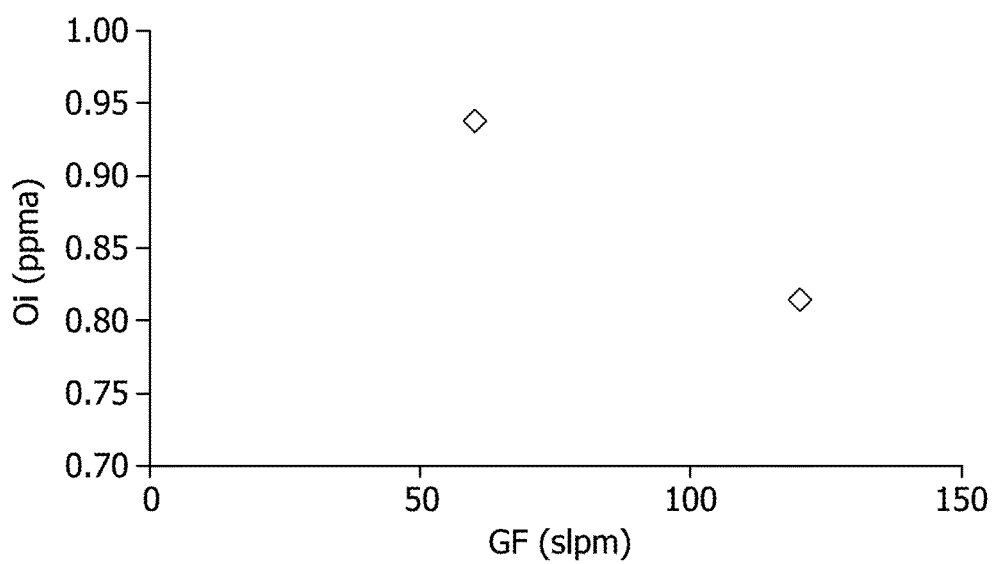
FIG. 10 is a graph plotting an inert gas flow rate versus an oxygen concentration.

FIG. 10 is a graph showing a modeled prediction of the gas flow rate in standard liters per minute (slpm) versus oxygen concentration. The graph indicates that increasing gas flow rate reduces oxygen concentration. In this embodiment, the argon gas flow rate is in a range from approximately 100 slpm to 150 slpm.

Inert gas pressure refers to the pressure of the argon gas flowing through vacuum chamber 101. Inert gas pressure impacts the SiO evaporation rate. Specifically, decreasing the argon gas pressure increases SiO evaporation and hence decreases SiO concentration in melt 109. In this embodiment, the argon gas pressure is in a range from approximately 10 torr to 30 torr.

Seed rotation refers to the rate at which pull shaft or cable 117 rotates seed crystal 115 about axis 119. Seed rotation impacts the flow of SiO from crucible 103 to crystal 113 and a rate of SiO evaporation from melt 109. A high seed rotation reduces the boundary layer thickness between melt line 111 and the gas above melt 109 to increase SiO evaporation. Further, a high seed rotation decreases melt flow from crucible 103 to crystal 113 by suppressing a buoyancy force. Moreover, a high seed rotation creates an outward radial flow that retards the inward flow (i.e., transport) of SiO from crucible 103, reducing the oxygen concentration.

Figure 11:
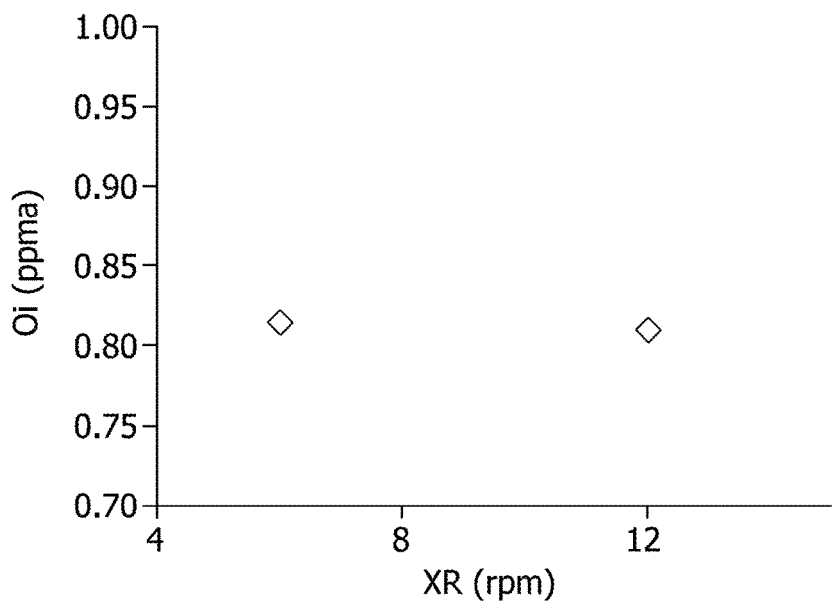
FIG. 11 is a graph plotting a seed rotation rate versus an oxygen concentration.

FIG. 11 is a graph showing a modeled prediction of the seed rotation rate in revolutions per minute (rpm) versus oxygen concentration. The graph indicates that increasing the seed rotation rate reduces oxygen concentration. Although the modeled prediction shows a relatively small impact of seed rotation on oxygen concentration, actual experimental results have demonstrated a significant reduction in oxygen concentration as the seed rotation rate is increased. In this embodiment, the seed rotation rate is in a range from approximately 8 to 14 rpm, and more specifically 12 rpm.

Cusp position refers to the position of the cusp of the magnetic field generated by coils 145 and 147. Cusp position impacts the wall temperature of crucible 103 and the flow of SiO from crucible 103 to crystal 113. More specifically, maintaining the cusp position below melt line 111 facilitates reducing the oxygen concentration.

Figure 12:
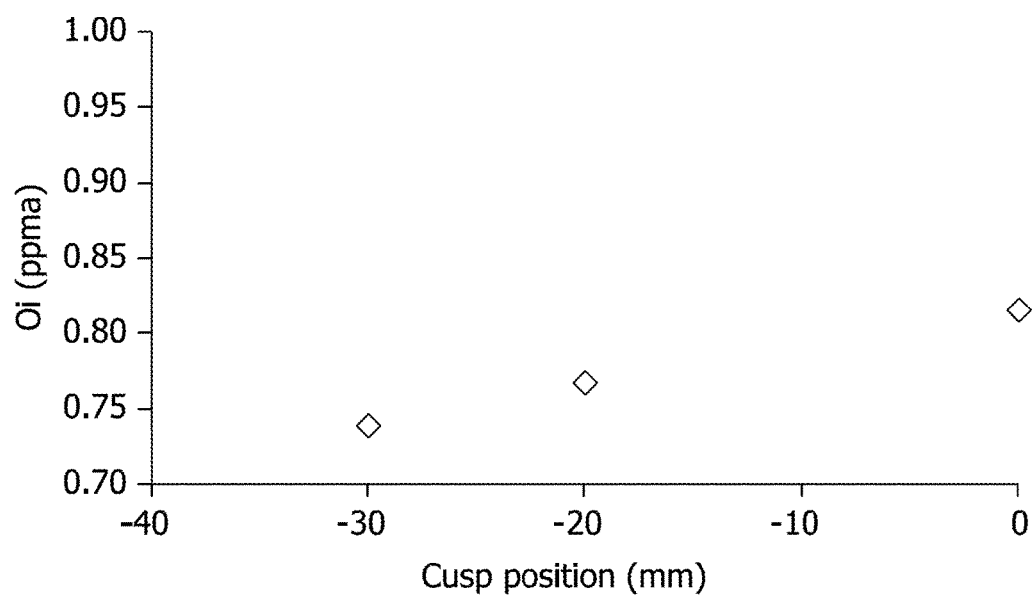
FIG. 12 is a graph plotting a cusp position versus an oxygen concentration.

FIG. 12 is a graph showing a modeled prediction of the cusp position in mm below melt line 111 versus oxygen concentration. The graph indicates that lowering the cusp position further below melt line 111 reduces oxygen concentration. In this embodiment, the cusp position is set in a range from approximately 10 mm to 40 mm below melt line 111, more specifically, in a range of approximately 25 mm to 35 mm below melt line 111, and even more specifically, at approximately 30 mm.

By controlling conditions (i.e., heater power, crucible rotation, magnet strength, seed lift, melt to reflector gap, inert gas flow, inert gas pressure, seed rotation, and cusp position), a plurality of process parameters (i.e., a wall temperature of a crucible, a flow of SiO from the crucible to a single crystal, and an evaporation of SiO from a melt) are regulated to produce silicon ingots having a low oxygen concentration. For example, the methods described herein facilitate producing a 300 mm silicon ingot with an oxygen concentration less that 5 ppma.

Wafers sliced from the silicon ingots formed using the systems and methods described herein may be utilized in a variety of applications. For example, insulated-gate bipolar transistors (IGBTs), high quality radio-frequency (RF), high resistivity silicon on insulator (HR-SOI), and charge trap layer SOI (CTL-SOI) applications typically require a low oxygen concentration in order to achieve high resistivity and to avoid formation of p-n junctions. Accordingly, wafers produced for IGBT applications using the methods described herein may have 30 to 300 ohm-centimeter (ohm-cm) N-type resistivity or greater than 750 ohm-cm N/P-type resistivity. Further, wafers produced for RF, HR-SOI, and/or CTL-SOI applicants using the methods described herein may be greater than 750 ohm-cm P-type product. In some embodiments the wafers produced are utilized as handle wafers.

For P-type wafers produced using the methods described herein, boron, aluminum, germanium, and/or indium may be used has a majority carrier, and red phosphorus, phosphorus, arsenic, and/or antimony may be used as a minority carrier. For N-type wafers produced using the methods described herein, red phosphorus, phosphorus, arsenic, and/or antimony may be used as the majority carrier, and boron, aluminum, germanium, and/or indium may be used as the minority carrier.

Due to the relatively low Oi, to improve mechanical strength and slip performance, wafers produced using the methods described herein may be co-doped (e.g., by doping the single crystal that forms the ingot) with nitrogen or carbon. For example, the nitrogen concentration may be varied between 0 to 8e15 atoms per cubic centimeter, and the carbon concentration may be varied between 0.0 to 2.0 ppma.

Embodiments of the methods described herein achieve superior results compared to prior methods and systems. For example, the methods described herein facilitate producing silicon ingots with a lower oxygen concentration than at least some known methods. Further, unlike at least some known methods, the methods described herein may be used for the production of ingots having a diameter greater than 150 mm.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above without departing from the scope of the invention, it is intended that all matter contained in the above description and shown in the accompanying drawings shall be interpreted as illustrative and not in a limiting sense.

What is claimed is:

1. A method for producing a silicon ingot, the method comprising:
   melting polycrystalline silicon in a crucible enclosed in a vacuum chamber to form a melt;
   generating a cusped magnetic field within the vacuum chamber;
   dipping a seed crystal into the melt; withdrawing the seed crystal from the melt to pull a single crystal that forms the silicon ingot, wherein the silicon ingot has a diameter greater than about 150 millimeters (mm); and
   simultaneously regulating a plurality of process parameters such that the silicon ingot has an oxygen concentration less than about 5 parts per million atoms (ppma), wherein the plurality of process parameters include a wall temperature of the crucible, a transport of silicon monoxide (SiO) from the crucible to the single crystal, and an evaporation rate of SiO from the melt,
wherein one of said process parameters comprises operating a heater positioned below the crucible at a power range from approximately 0 to 5 kilowatts.

2. A method in accordance with claim 1, wherein the silicon ingot has a diameter in a range from approximately 150 mm to 460 mm.

3. A method in accordance with claim 1, wherein the silicon ingot has a diameter of approximately 300 mm.

4. A method in accordance with claim 1, wherein simultaneously regulating a plurality of process parameters comprises operating a heater positioned below the crucible at a power of approximately 0 kilowatts.

5. A method in accordance with claim 1, wherein simultaneously regulating a plurality of process parameters comprises rotating the crucible at a rate in a range from approximately 1.3 rpm to 2.2 rpm.

6. A method in accordance with claim 1, wherein simultaneously regulating a plurality of process parameters comprises rotating the crucible at a rate of approximately 1.7 rpm.

7. A method in accordance with claim 1, wherein generating a cusped magnetic field comprises generating a cusped magnetic field having a magnetic field strength in a range from approximately 0.02 to 0.05 Tesla at an edge of the single crystal at a melt-solid interface, and having a magnetic field strength in a range from approximately 0.05 to 0.12 Tesla at a wall of the crucible.

8. A method in accordance with claim 1, wherein the silicon ingot has a diameter of approximately 300 mm, and wherein simultaneously regulating a plurality of process parameters comprises withdrawing the seed crystal at a rate in a range from approximately 0.42 mm per minute to 0.55 mm per minute.

9. A method in accordance with claim 1, wherein the silicon ingot has a diameter of approximately 300 mm, and wherein simultaneously regulating a plurality of process parameters comprises withdrawing the seed crystal at a rate of approximately 0.46 mm per minute.

10. A method in accordance with claim 1, wherein the silicon ingot has a diameter of approximately 200 mm, and wherein simultaneously regulating a plurality of process parameters comprises withdrawing the seed crystal at a rate in a range from approximately 0.55 mm per minute to 0.85 mm per minute.

11. A method in accordance with claim 1, wherein the silicon ingot has a diameter of approximately 200 mm, and wherein simultaneously regulating a plurality of process parameters comprises withdrawing the seed crystal at a rate of approximately 0.7 mm per minute.

12. A method for producing a silicon ingot, the method comprising:
melting polycrystalline silicon in a crucible enclosed in a vacuum chamber to form a melt;
generating a cusped magnetic field within the vacuum chamber;
dipping a seed crystal into the melt withdrawing the seed crystal from the melt to pull a single crystal that forms the silicon ingot, wherein the silicon ingot has a diameter greater than about 150 millimeters (mm); and
simultaneously regulating a plurality of process parameters such that the silicon ingot has an oxygen concentration less than about 5 parts per million atoms (ppma), wherein the plurality of process parameters include a wall temperature of the crucible, a transport of silicon monoxide (SiO) from the crucible to the single crystal, and an evaporation rate of SiO from the melt; wherein simultaneously regulating a plurality of process parameters comprises maintaining a melt to reflector gap in a range from approximately 60 mm to 80 mm.

13. A method in accordance with claim 1, wherein simultaneously regulating a plurality of process parameters comprises maintaining a melt to reflector gap of approximately 70 mm.

14. A method in accordance with claim 1, wherein simultaneously regulating a plurality of process parameters comprises flowing argon gas through the vacuum chamber at a flow rate in a range from approximately 100 standard liters per minute (slpm) to 150 slpm.

15. A method in accordance with claim 1, wherein simultaneously regulating a plurality of process parameters comprises flowing argon gas through the vacuum chamber at a pressure in a range from approximately 10 torr to 30 torr.

16. A method in accordance with claim 1, wherein simultaneously regulating a plurality of process parameters comprises rotating the seed crystal at a rate in a range from approximately 8 rpm to 14 rpm.

17. A method in accordance with claim 1, wherein simultaneously regulating a plurality of process parameters comprises rotating the seed crystal at a rate of approximately 12 rpm.

18. A method for producing a silicon ingot, the method comprising:
melting polycrystalline silicon in a crucible enclosed in a vacuum chamber to form a melt;
generating a cusped magnetic field within the vacuum chamber;
dipping a seed crystal into the melt withdrawing the seed crystal from the melt to pull a single crystal that forms the silicon ingot, wherein the silicon ingot has a diameter greater than about 150 millimeters (mm); and
simultaneously regulating a plurality of process parameters such that the silicon ingot has an oxygen concentration less than about 5 parts per million atoms (ppma), wherein the plurality of process parameters include a wall temperature of the crucible, a transport of silicon monoxide (SiO) from the crucible to the single crystal, and an evaporation rate of SiO from the melt; wherein simultaneously regulating a plurality of process parameters comprises positioning a cusp of the generated magnetic field in a range from approximately 10 mm to 40 mm below a surface of the melt.

19. A method in accordance with claim 1, wherein simultaneously regulating a plurality of process parameters comprises positioning a cusp of the generated magnetic field approximately 30 mm below a surface of the melt.

20. A method in accordance with claim 1, further comprising measuring agglomerated point defects of the silicon ingot using laser light.

21. A method in accordance with claim 20, wherein the measured defects include less than 400 defects having a size less than 60 nm, less than 100 defects having a size between 60 and 90 nm, and less than 100 defects having a size between 90 and 120 nm.

22. A method in accordance with claim 1, further comprising doping the single crystal with one of nitrogen and carbon.

23. A method in accordance with claim 22, wherein doping the single crystal comprises doping the single crystal with nitrogen such that a nitrogen concentration is within a range from 0 atoms per cubic centimeter to 8e15 atoms per cubic centimeter.

24. A method in accordance with claim 22, wherein doping the single crystal comprises doping the single crystal with carbon such that a carbon concentration is within a range from 0.0 to 2.0 ppma.

25. A wafer generated from a silicon ingot that is produced using the method of claim 1.

26. A wafer in accordance with claim 25, wherein the wafer has 30 ohm-cm to 300 ohm-centimeter N-type resistivity such that the wafer is suitable for use in IGBT applications.

27. A wafer in accordance with claim 25, wherein the wafer has greater than 750 ohm-cm N/P-type resistivity such that the wafer is suitable for use in IGBT applications.

28. A wafer in accordance with claim 25, wherein the wafer has greater than 750 ohm-cm P-type resistivity such that the wafer is suitable for use in RF, HR-SOI, and CTL-SOI applications.

29. A wafer in accordance with claim 25, wherein the wafer is a handle wafer.

30. A wafer in accordance with claim 25, wherein the wafer is a P-type product having at least one of boron, aluminum, germanium, and indium as a majority carrier, and having at least one of red phosphorus, phosphorus, arsenic, and antimony as a minority carrier.

31. A wafer in accordance with claim 25, wherein the wafer is a N-type product having at least one red phosphorus, phosphorus, arsenic, and antimony as a majority carrier, and having at least one of boron, aluminum, germanium, and indium as a minority carrier.

32. The method in accordance with claim 12, further comprising doping the single crystal with one of nitrogen and carbon.

33. The method in accordance with claim 18, further comprising doping the single crystal with one of nitrogen and carbon.

34. A wafer generated from a silicon ingot that is produced using the method of claim 12.

35. A wafer generated from a silicon ingot that is produced using the method of claim 18.

* * * * *